United States Patent
Park et al.

[11] Patent Number: 5,939,745
[45] Date of Patent: *Aug. 17, 1999

[54] DYNAMIC ACCESS MEMORY USING SILICON-ON-INSULATOR

[75] Inventors: Kyucharn Park, Kyungki-do; Yeseung Lee; Cheonsu Ban, both of Seoul; Kyungwook Lee, Kyungki-do, all of Rep. of Korea

[73] Assignee: Samsung Electronics Co., Ltd., Suwon, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/835,782

[22] Filed: Apr. 15, 1997

Related U.S. Application Data

[60] Continuation of application No. 08/439,081, May 11, 1995, abandoned, which is a division of application No. 08/170,589, Dec. 22, 1993, abandoned.

[30] Foreign Application Priority Data

Dec. 30, 1992 [KR] Rep. of Korea .................... 92-26778

[51] Int. Cl.[6] .................... H01L 27/108; H01L 27/12
[52] U.S. Cl. .................... 257/304; 257/309; 257/306; 257/350; 257/347
[58] Field of Search .................... 257/306–309, 257/350, 301, 311, 302, 304, 67, 69, 347

[56] References Cited

U.S. PATENT DOCUMENTS

| | | | |
|---|---|---|---|
| 4,907,047 | 3/1990 | Kato et al. | 257/304 |
| 5,102,819 | 4/1992 | Matsushita et al. | 438/245 |
| 5,119,155 | 6/1992 | Hieda et al. | 257/304 |
| 5,414,285 | 5/1995 | Nishihara | 257/301 |
| 5,414,655 | 5/1995 | Ozaki et al. | 257/306 |

FOREIGN PATENT DOCUMENTS

| | | | |
|---|---|---|---|
| 2-60163 | 2/1990 | Japan | 257/301 |
| 4-107858 | 4/1992 | Japan | 257/301 |

OTHER PUBLICATIONS

Toshiyuki Nishihara et al. "A Buried Capacitor DRAM Cell With Bonded Soi for 256M and 1Gbit DRAMs" ULSI Research & Development Group, Sony Corporation 4–14–1 Asahi–cho, Aisugi–shi, Kanagawa 243, Japan. pp. 32.2.1–32.2.4, IEDM 1992.

*Primary Examiner*—John Guay
*Attorney, Agent, or Firm*—Jones, Volentine, Steinberg & Whitt, L.L.P.

[57] ABSTRACT

The present invention discloses a method for making a dynamic random access memory by silicon-on-insulator comprising the steps of: dividing a cell area and a peripheral area on a first silicon substrate and recessing just the cell area where a memory device is formed; forming a first insulating layer by isolation of electrical elements in order to divide an active region and a passive region; forming and patterning a first conductive layer through a contact to which the active region and a capacitor are connected on the insulating layer to form a storage node; forming a dielectric layer of the capacitor on the storage node; forming and patterning a polysilicon layer on the dielectric layer to form a storage node; forming a second insulating layer on the plate node and planarizing the insulating layer by thermal treatment; forming a third conductive layer to a predetermined thickness on the planarized insulating layer; polishing and planarizing the third conductive layer by chemical-mechanical polishing technique, using the second insulating layer as an etchstopper and bonding a second silicon substrate on the planarized third conductive layer; planarizing a backside of the first substrate by a chemical-mechanical polishing technique and exposing the active region; and forming a switching element on the forming a bit line.

9 Claims, 9 Drawing Sheets

DYNAMIC ACCESS MEMORY USING SILICON-ON-INSULATOR

This is a Continuation of application Ser. No. 08/439,081, filed May 11, 1995, which was abandoned upon the filing hereof, which is a division of application Ser. No. 08/170,589, filed Dec. 22, 1993, abandoned.

BACKGROUND OF THE INVENTION

1. Field of the Invention

The present invention relates generally to a dynamic random access memory (DRAM). More particularly, the present invention relates to a DRAM using a modified silicon-on-insulator (SOI) technology in which transistors are formed by silicon direct bonding (SDB) following chemical-mechanical polishing (CMP) of a substrate surface, and after storage cell capacitors have been formed by silicon direct bonding and silicon-on-insulator technology. In addition, the present invention relates to a DRAM in which SOI devices are formed on only specific areas of the DRAM including the memory cells.

2. Description of the Prior Art

Remarkable progress has been made in the manufacture of ever more highly integrated DRAMS. For example, 4 Mbit DRAMs have now supplanted 1 Mbit DRAMs as the industry's standard memory device. Unfortunately, as conventional semiconductor memory devices shrink in size, it becomes increasingly difficult to obtain devices having memory cells of sufficient capacitance.

In conventional, highly integrated DRAMs, the predetermined capacitance of the cell storage capacitor must be kept relatively constant, in spite of the decreased surface area occupied by each of the cell. For example, in a 64 Mbit DRAM each storage cell is allocated an area of only $0.8\ \mu m^2$ to $1.0\ \mu m^2$.

In situations where the area allocated to each storage cell decreases to the point where cell capacitance becomes inadequate to hold the requisite charge, a soft error may occur upon exposure of the memory cell to $\alpha$ particles, thus creating reliability problems for the semiconductor memory device. Accordingly, the capacitance of storage cell capacitors must be kept relatively constant to avoid such errors, in spite of the necessary decrease in surface area allocated to individual storage cell capacitors.

In current conventional DRAMs having memory cells based on transistor-stacked capacitor combinations, one of a pair of storage capacitor electrodes is routinely formed with a three-dimensional structure. This three-dimensional structure increases cell capacitor capacitance by 30 to 40%, as compared with two-dimensional capacitor structures of similar size. Three-dimensional capacitor structures are but one example of recent efforts to increase memory cell capacitance without increasing the area allocated for each cell. Improved materials having high dielectric constants have also been studied. One proposed method for obtaining higher cell capacitance in defined small areas is described in "A 1.28 $\mu m$ Bit-Line Shielded Memory Cell Technology for 64 MB DRAMS" among the 1990 symposium of VLSI TECHNOLOGY.

Conventional CMOS memory devices suffer from a plurality of design and performance problems. Among these, current fabrication processes and resulting structures may inadvertently create active parasitic devices within the memory device structure, such as parasitic metal oxide semiconductor transistors, or parasitic bipolar transistors in a PN junction-separation structure. In addition, common problems include the deterioration of electrical devices within the memory device, and the occurrence of soft errors due to the latch-up phenomenon. In order to prevent these problems while attaining higher integration densities, silicon-on-insulator (SOI) techniques have been studied wherein insulating layers are formed as sidewalls of an insulating substrate formed of a material such as $SiC_2$, and wherein silicon single crystalline wells are formed in these insulating layers to form semiconductor devices.

These techniques have advantages of perfect isolation of electrical elements, and high speed performance free from latch-up and soft errors. Other advantages include the ability to determine the width of insulating layers for isolation based upon photo-etching process steps, etc. Finally, increased integration based on the micro-miniaturization can be obtained in an environment which allows the application with three-dimensional devices.

According to the above techniques, a semiconductor device having a SOI structure is formed by forming an amorphous or polysilicon layer on an amorphous insulating substrate such as $SiO_2$ and by performing recrystallization on the polysilicon layer. Separation by implanted oxygen (SIMOX) processes and full isolation by porous oxidized silicon (FIPOS) processes are also known as another approach.

However, these techniques are not without their drawbacks. When it comes to SIMOX technologies, a specially designed oxide ion implanting means is required to form an insulating layer inside the substrate. The FIPOS processes require anodization for just these processes. Zone melting (ZMR) requires recrystallization.

Figure 1:
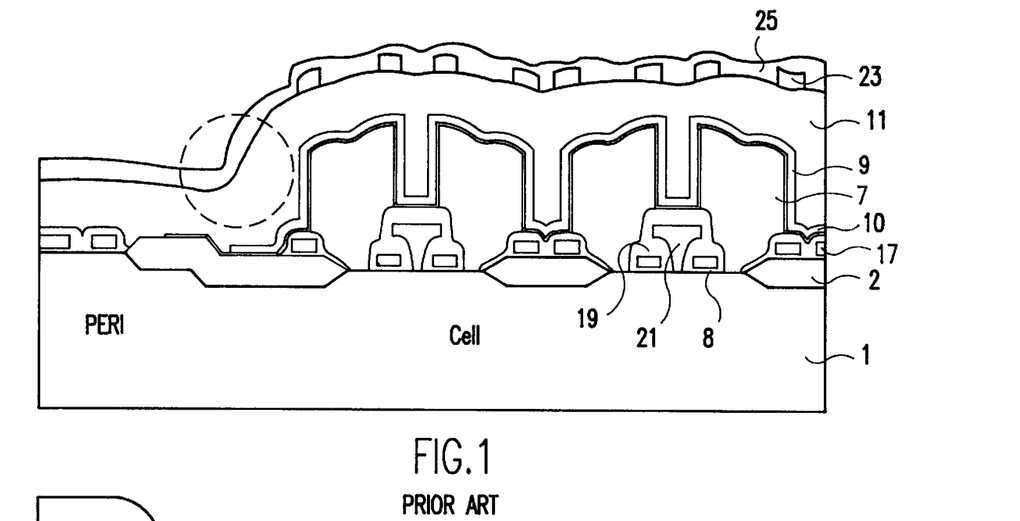
FIG. 1 is a sectional view of a conventional dynamic random access memory (DRAM)

A method of forming a conventional DRAM is now described with reference to FIG. 1. In FIG. 1, a field oxide layer 2 is formed by a selective oxidation on a silicon substrate 1 and isolation of electrical elements is performed. After that, a gate oxide 8 is grown, and a gate electrode 17 is patterned to form a source/drain region. Inter layer insulation is carried out by an oxide layer 19 formed by a chemical vapor deposition method. Next, a conductive layer 21 is deposited and patterned.

After a second interlayer insulation is carried out, a contact hole is opened so that a lower capacitor electrode 7 contacts the substrate. Thereafter, lower electrode 7 is patterned. A dielectric layer 10 and an upper electrode 9 are then formed.

Successively, after a third interlayer insulation is performed, a protective layer 25 is finally formed to complete the manufacture of the semiconductor memory cell.

As shown in the above process, a memory cell having sufficient capacitance is attained in the manufacture of the highly integrated DRAM by use of a three-dimensional stack type capacitor. Unfortunately, in stack type capacitor applications greater than 64 Meg, the storage cell obtains a very high profile in order to secure the capacitance required by the cell capacitor. If the storage cell (or node) is raised in this manner, the large step-like difference between cell part and a peripheral part, contact or metallization can not be easily performed.

In the formation of P-MOS transistors, high temperature processing should be minimized in order to maintain transistor characteristics and the isolation of electrical elements. As a result, it is hard to perform planarization by borophosphosilicate glass (BPSG) flow due to this condition.

Increased DRAM integration brings with it increased difficulty in forming patterns. That is, not only is the size of patterns small, but also high overlay accuracy is necessary.

Since there is a large step-like difference resulting from the height of the cell capacitor, it is difficult to secure a sufficient alignment margin.

If device planarity is increased so as to remove the step-like difference, the depth of the contact metallization must be increased. Various problems may occur by step-coverage or etch damage. One study tried to solve these problems by forming a capacitor in advance by direct wafer bonding and silicon-on-insulator processes and then making transistors on the opposite silicon surface. However, if a DRAM cell is made this way, peripheral circuit devices become SOI devices, and it is difficult to find a processing condition that meets both characteristics.

That is to say, n-type MOS and p-type MOS transistors having different widths and lengths should preferably be made into SOI devices, but heretofore it has been difficult to form active devices of different size using a SOI technique.

SUMMARY OF THE INVENTION

The present invention provides a method for making a DRAM capable of preventing deterioration in the characteristics of a transistor due to subsequent thermal treatment. The present invention also addresses the problems associated with a grounding plate. These benefits result, at least in part, from the formation of a transistor after a cell area has been deeply recessed on a semiconductor substrate.

The present invention provides a method for making a DRAM using a silicon-on-insulator technique so as to maintain the advantages of direct wafer bonding (DWB) and silicon-on-insulator (SOI) techniques and to apply the technique applied to the bulk silicon directly to the peripheral circuit devices. This benefit can be achieved by forming an access transistor in a cell area on a silicon-on-insulator of less than 100 $\mu$m, and by forming devices other than the access transistor on a silicon-on-insulator of more than 1 $\mu$m so as to display characteristics of devices formed on the bulk silicon.

In accordance with a first preferred embodiment, a method for making a dynamic random access memory by silicon-on-insulator comprises the steps of:

dividing a cell area and a peripheral area on a first silicon substrate and recessing just the cell area where a memory device is formed;

forming a first insulating layer by isolation of electrical elements in order to divide an active region and a passive region;

forming and patterning a first conductive layer through a contact to which the active region and a capacitor are connected on the insulating layer to form a storage node;

forming a dielectric layer of the capacitor on the storage node;

forming and patterning a polysilicon layer on the dielectric layer to form a storage node;

forming a second insulating layer on the plate node and planarizing the insulating layer by thermal treatment;

forming a third conductive layer to a predetermined thickness on the planarized insulating layer;

polishing and planarizing the third conductive layer by chemical-mechanical polishing technique, using the second insulating layer as an etchstopper and bonding a second silicon substrate on the planarized third conductive layer;

planarizing a backside of the first substrate by a chemical-mechanical polishing technique and exposing the active region; and forming a switching element on the forming a bit line.

The dynamic random access memory made by silicon-on-insulator according to the first embodiment, comprises:

an active silicon layer formed to be divided into several parts and separated from each other by chemically and mechanically polishing and planarizing a backside of a first substrate having a recessed cell area where a memory device will be formed;

a first insulating layer formed to be divided into an active region and a passive region on the active silicon layer;

a storage node formed on right and left sides of a contact on the first insulating layer;

a plate node formed on the storage node;

a second insulating layer formed on the plate node;

a handling wafer bonded to a pattern of a polysilicon layer deposited on the second insulating layer and polished chemically and mechanically and planarized;

a gate electrode formed on the active silicon layer;

a third insulating layer formed to be divided into several parts and separated from each other on the active silicon layer where the gate electrode is formed; and a bit line formed on the third insulating layer.

In accordance with a second preferred embodiment of this invention, a method for making a dynamic random access memory by silicon-on-insulator comprises the steps of:

recessing a specified area including a dynamic random access memory cell is formed on a silicon substrate;

forming a well on the substrate;

forming a trench in order to isolate electrical elements between cells in the recessed area and form an align-key;

filling the trench with buried oxide;

forming a buried contact on the buried oxide;

forming a capacitor;

planarizing a pattern formed by the processes;

bonding an active wafer passed the processes to a handle wafer;

removing a silicon of the active wafer to a bottom of the trench;

wet-etching a silicon layer formed on an area that is not recessed on the silicon substrate and performing isolation of electrical elements by means of a local oxidation of silicon process;

forming devices of a peripheral circuit such as n-type and p-type metal oxide semiconductors and a register pattern in a conventional manner;

forming devices such as a metal oxide semiconductor and a transistor on the recessed area of the silicon substrate;

forming contacts simultaneously on a plate node, a cell, a gate and a metallization of the peripheral circuit and on a bit line, respectively;

forming simultaneously a bit line of the cell area and the metallization of the peripheral circuit; and carrying out passivation and alloying on the pattern.

BRIEF DESCRIPTION OF THE DRAWINGS

The above and further objects, features and advantages of the present invention will become more apparent from the following detailed description of embodiments taken in conjunction with the accompanying drawings.

FIGS. 3A to 3I depict the steps in the manufacture of a DRAM by silicon-on-insulator processes in accordance with a second preferred embodiment of this invention;

DESCRIPTION OF THE PREFERRED EMBODIMENTS

A detailed description of the present invention will now be made referring to the accompanying drawings.

A first preferred embodiment of a method for making a dynamic random access memory (DRAM) using silicon-on-insulator (SOI) techniques is described as follows. FIGS. 2A to 2G depict steps in the preferred method for the manufacture of a DRAM using silicon-on-insulator processes in accordance with the first preferred embodiment of the present invention.

Figure 2A:
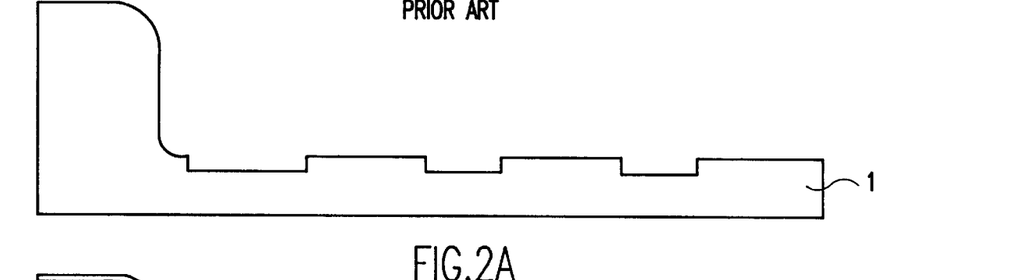
FIGS. 2A to 2G depict the steps in the manufacture of a DRAM by silicon-on-insulator processes in accordance with a first preferred embodiment of this invention.

As shown in FIG. 2A, the method of manufacturing a dynamic random access memory (DRAM) includes a first step of dividing a first single crystalline silicon substrate 1 into a "cell part" and a "peripheral part," and deeply recessing a portion of the substrate in only the cell part where a memory device will ultimately be formed.

Figure 2B:
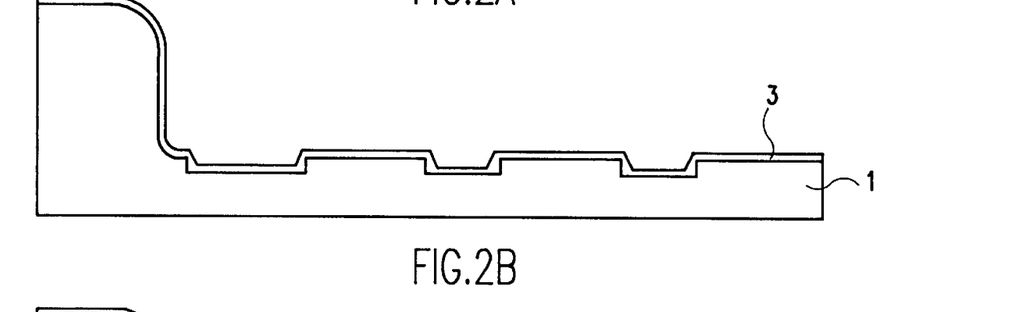

Next, as shown in FIG. 2B, a first insulating layer 3 is formed to separate an active region from a passive region.

Figure 2C:
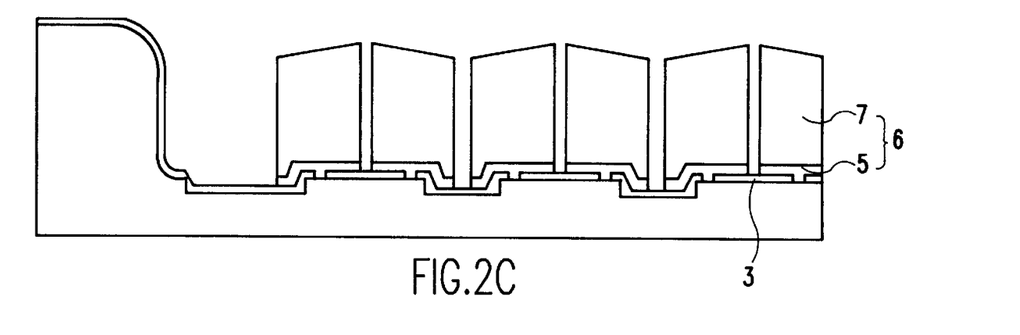

A first conductive polysilicon layer comprising conductive polysilicon layer portions 5 and 7, is formed on insulating layer 3 with conductive polysilicon layer portion 5 formed in contact with substrate 1 through a contact hole. The active region and capacitor are thus connected, as shown in FIG. 2C to form a storage node 6.

Figure 2D:
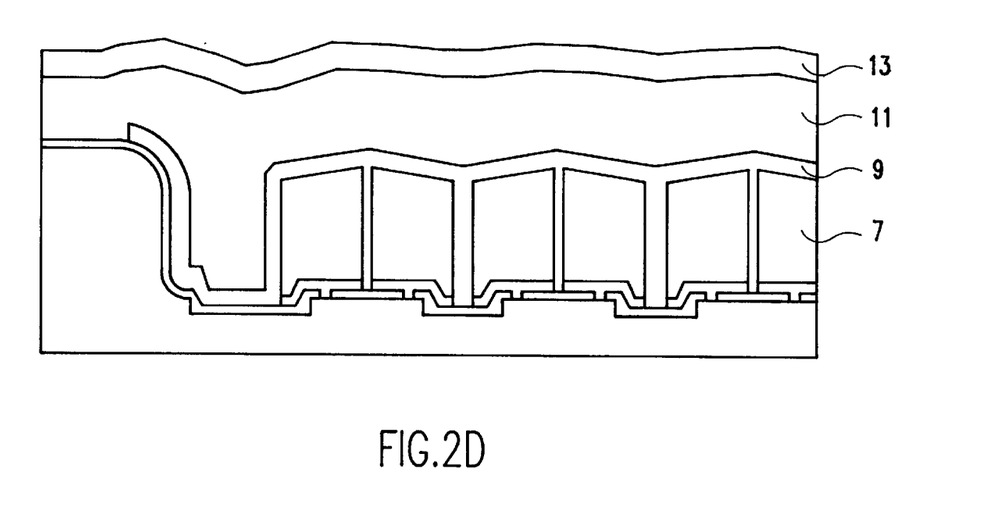

Thereafter, as shown in FIG. 2D, a capacitor dielectric layer (not shown), and a second polysilicon layer are formed and patterned on storage node 6 to form a plate node 9. Next, a second insulating layer 11 is formed and patterned on plate node 9, and thereafter planarized. A third polysilicon layer 13 is formed to a predetermined thickness on the planarized second insulating layer 11.

Figure 2E:
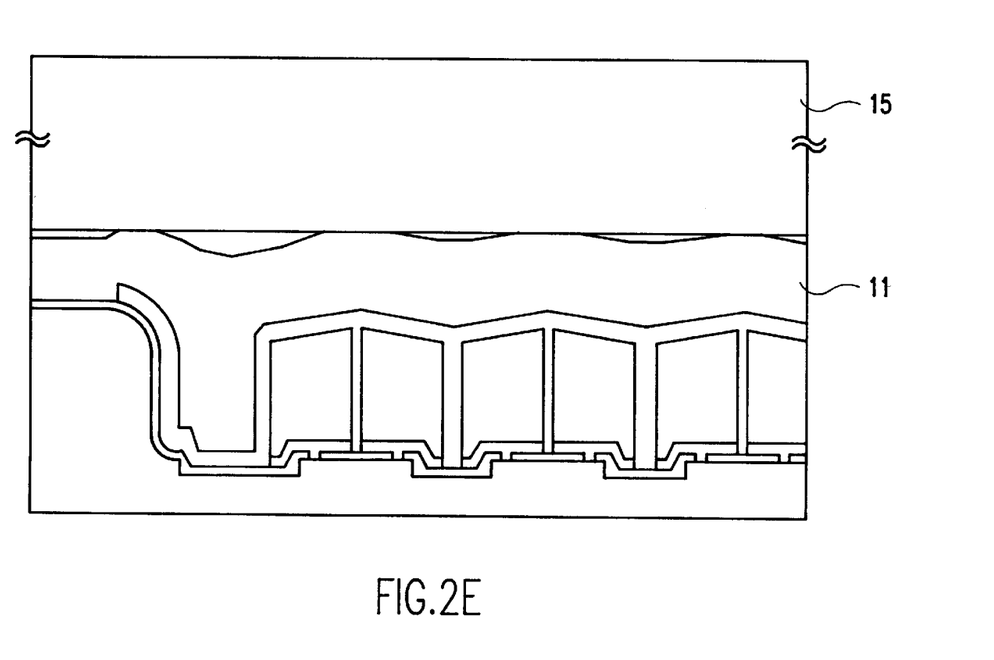

Referring to FIG. 2E, third polysilicon layer 13 is subsequently polished, chemically and mechanically, using second insulating layer 11 as an etchstopper.

After bonding a handling wafer 15 on the polished surface of the resulting structure an active silicon layer 1' is exposed by thinning a backside part of first substrate 1 using a chemical-mechanical polishing method. See FIG. 2F.

Figure 2F:
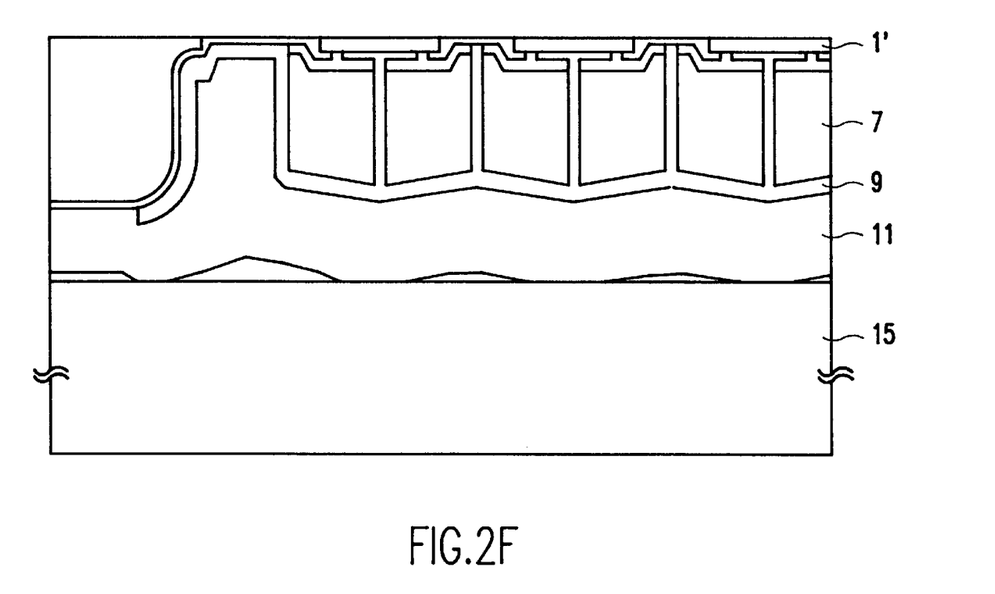
Figure 2G:
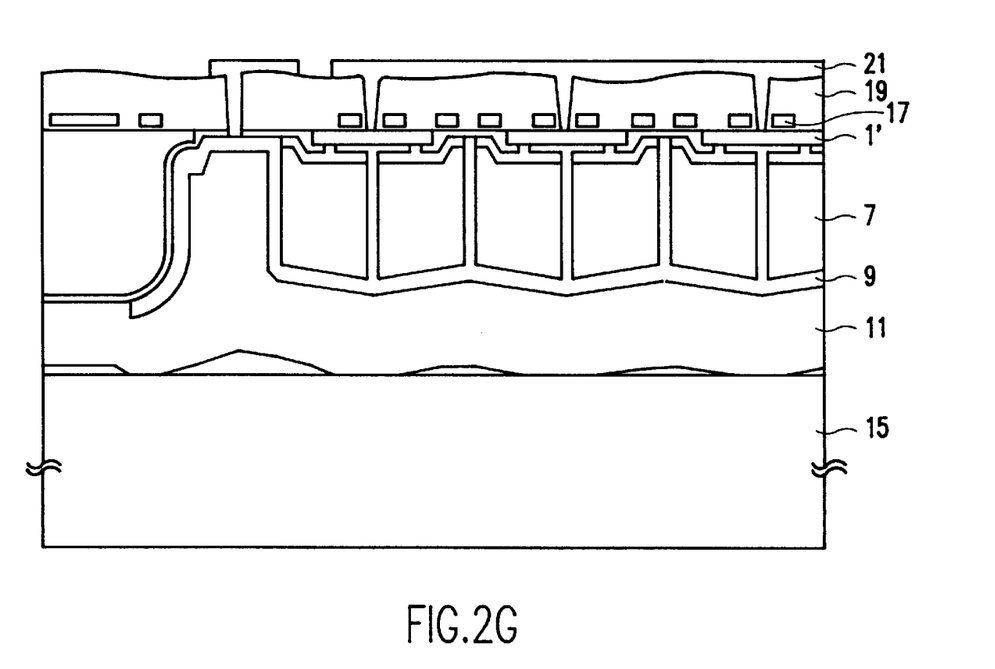

Referring to FIG. 2G, a gate electrode 17 is formed on active silicon layer 1'. Finally, a predetermined access device is formed by applying a third insulating layer 19 and forming a bit line 21.

To explain the above processes in greater detail, the cell part of the substrate where a memory device is ultimately formed is deeply recessed after the cell part and peripheral part have been divided on single-crystalline silicon substrate 1, as shown in FIG. 2A.

The cell part is recessed more than the height of the memory device capacitor. After just the part that will be isolated in the recessed cell part is etched to a thickness of more than 500 angstroms using a shallow trench technique, an oxide layer is then formed to cure damage caused by the etching process, and a high temperature oxide (HTO) and a borophosphosilicate glass (BPSG) are united with each other to form insulating layer 3 having a thickness sufficient to perform its isolation function.

A first conductive layer of polysilicon having portions 5 and 7 is formed on insulating layer 3 to a predetermined thickness, such that sufficient capacitance can be obtained through the contact to which the active region and capacitor are connected. After patterning first conductive layer (5,7), storage node 6 is formed. The first conductive layer is deposited by a differential doped polysilicon deposition that forms a doped polysilicon layer 7 thickly, after an undoped polysilicon layer 5 is thinly formed. When a junction of the source region is formed by a successive thermal treatment after the capacitor processes, the above method step prevents the junction from being formed too deeply. The first conductive layer is patterned to form storage node 6.

Dielectric layers of the capacitor are formed of various high dielectric materials such as oxide film/nitride film/oxide film that does not appear on the pattern where storage node 6 is formed as shown in FIG. 2D. The second polysilicon conductive layer is formed and patterned to form plate node 9, thereby completing the capacitor formation processes.

After second insulating layer 11, in which HTO and BPSG are united, is thickly formed and planarized by thermal treatment, third polysilicon layer 13 is formed to a predetermined thickness.

As shown in FIG. 2E, polysilicon layer 13 is planarized by CMP method in which insulating layer 11 serves as an etch stopper, and a glass side of handling wafer 15 is bonded on the planarized polysilicon layer. The bonding method is conventional, i.e. the bonding is performed by thermal treatment.

Referring now to FIG. 2F, the resulting structure is turned upside down, and the backside of the wafer where the capacitors are formed is polished by CMP method using insulating layer 3 as an etch stopper.

Successively, as shown in FIG. 2G, gate electrode 17 is formed on the remaining active silicon layer 1', and the source/drain region is made by ion-implantation to form switching elements. After that, insulating layer 19 is applied and bit line 21 is formed.

The above-mentioned contact is formed on the borderline between the cell part and the peripheral part to be connected with plate node 9. The second conductive layer of the capacitor formed in the opposite side. The plate node 9 can be grounded after insulating layer 3 formed in the field area and the dielectric layer for the capacitor are removed completely.

After metallization and passivation processes, the memory device according to the present invention is completed.

A second preferred embodiment of a method for manufacturing a DRAM using SOI technology is described as follows.

Figure 3A:
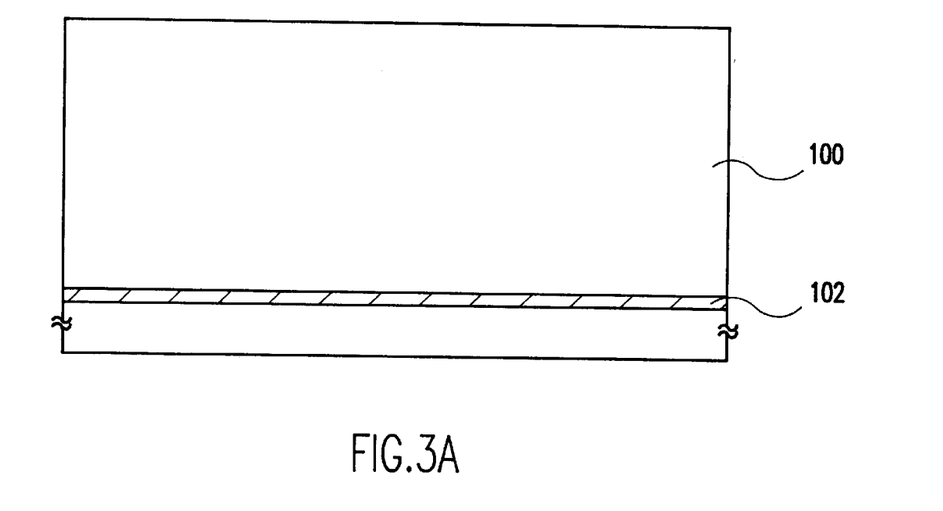

FIGS. 3A to 3I depict the steps in the second preferred embodiment of the present invention. FIG. 4 depicts a joining machine used during the manufacture of the DRAM in accordance with the second preferred embodiment of this invention.

In the method steps for making a DRAM in accordance with the second preferred embodiment of this invention, access transistors for memory cell areas are formed on SOI having a thickness of less than 100 nm. Devices other than the access transistors, e.g. peripheral circuits, are formed on SOI having a thickness of at least 1 μm so that they will display the characteristics of the devices formed on bulk silicon.

The method steps include a first step of recessing certain portions of a silicon substrate 100 including portions of the substrate where DRAM cells are to be formed; a second step of forming conductive p-type and n-type wells in the substrate; a third step of forming a trench 104 to isolate peripheral circuit elements from memory cells, and to form align-keys on the recessed area; a fourth step of filling trench 104 with a buried oxide 106; a fifth step of forming a buried contact 108 on buried oxide 106; a sixth step of forming storage capacitors; a seventh step of planarizing the resulting structure formed by the above steps; an eighth step of cutting the active wafer on which the above steps are carried out to join it with a handle wafer 112; a ninth step of recessing the silicon on the second surface of the active wafer to nearly the bottom of the trench formed in the third step; a tenth step of wet-etching the portion of the silicon formed on the area that is not recessed in the first step and isolating electrical elements, e.g. peripheral circuit, by a local oxidation of silicon (LOCOS) process; an eleventh step of forming specific peripheral circuits such as n-type MOS and p-type MOS transistors and register patterns after the above processes; a twelfth step of forming MOS transistors on the recessed area of the silicon substrate; a thirteenth step of simultaneously forming contacts and bit-line contacts on a plate node, a cell, gate electrodes of a peripheral circuit and a line of the peripheral circuit; a fourteenth step of forming a bit line of the cell area and a line of the peripheral circuit; and a fifteenth step of carrying out passivation and alloying on the pattern after the above steps.

The above steps will now be described in greater detail with reference to the drawings.

As a first step, boron and Ge are ion-implanted by a high energy of $1E20/cm^2$ on a bare silicon 100. An etchstopper layer 102 is then formed on substrate 100 for use as an etchstopper when the active wafer is thinned in a subsequent process step. After direct wafer bonding (DWB) treatment, a portion of the silicon in an area where a thin SOI is to be formed is wet-etched and recessed by a thickness I. Recessing an oxide layer after local oxidation, instead of the wet etching the silicon, may be alternatively performed, but such has the difficulty of recessing the oxide layer to a depth of more than 1 $\mu$m. Recessing by wet-etching the silicon has a problem of uniformity of recessed depth. Therefore, boron and Ge are ion-implanted at high energy of $1E20/cm^2$ to create an etchstopper at the time of recessing, and in such a case, two etchstop layers 102 having different thicknesses are used.

The p-type well and n-type well are respectively and selectively formed by ion-implantation of boron and phosphorous in the second step.

The third step uses a thermal oxide layer of more than 30 nm as a mask for trench etching. The depth of the trench is preferably between 150 nm and 300 nm, patterning is carried out to define the area wherein isolated electrical elements are subsequently formed, the region where a contact to a plate node 116 is formed, and the align-key necessary for the sixth step is also formed. After the formation of trench 104, boron or $BF_2$ is ion-implanted for doping the element-isolated area, and the oxide layer serving as the mask is removed.

Figure 3B:
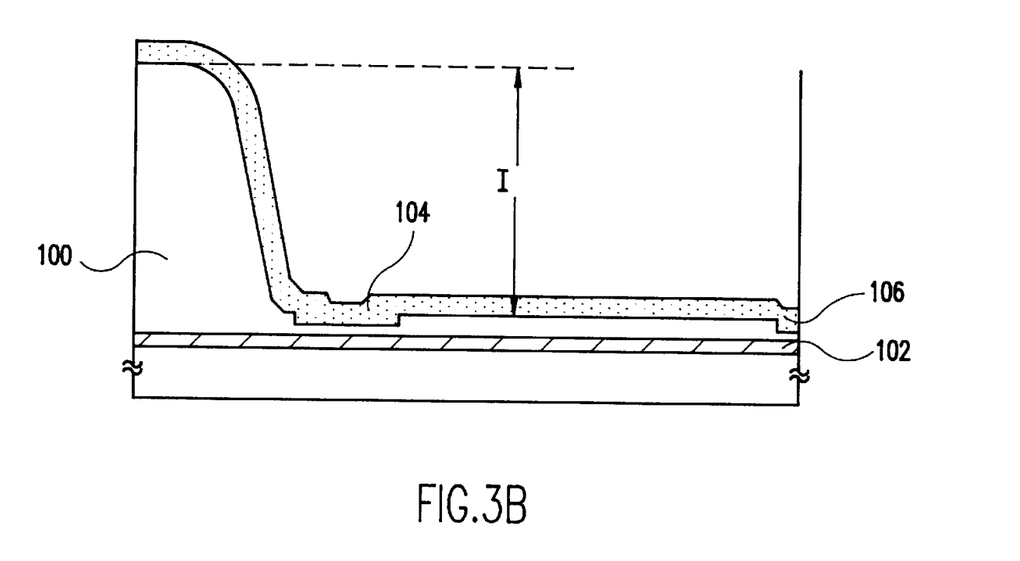
Figure 4:
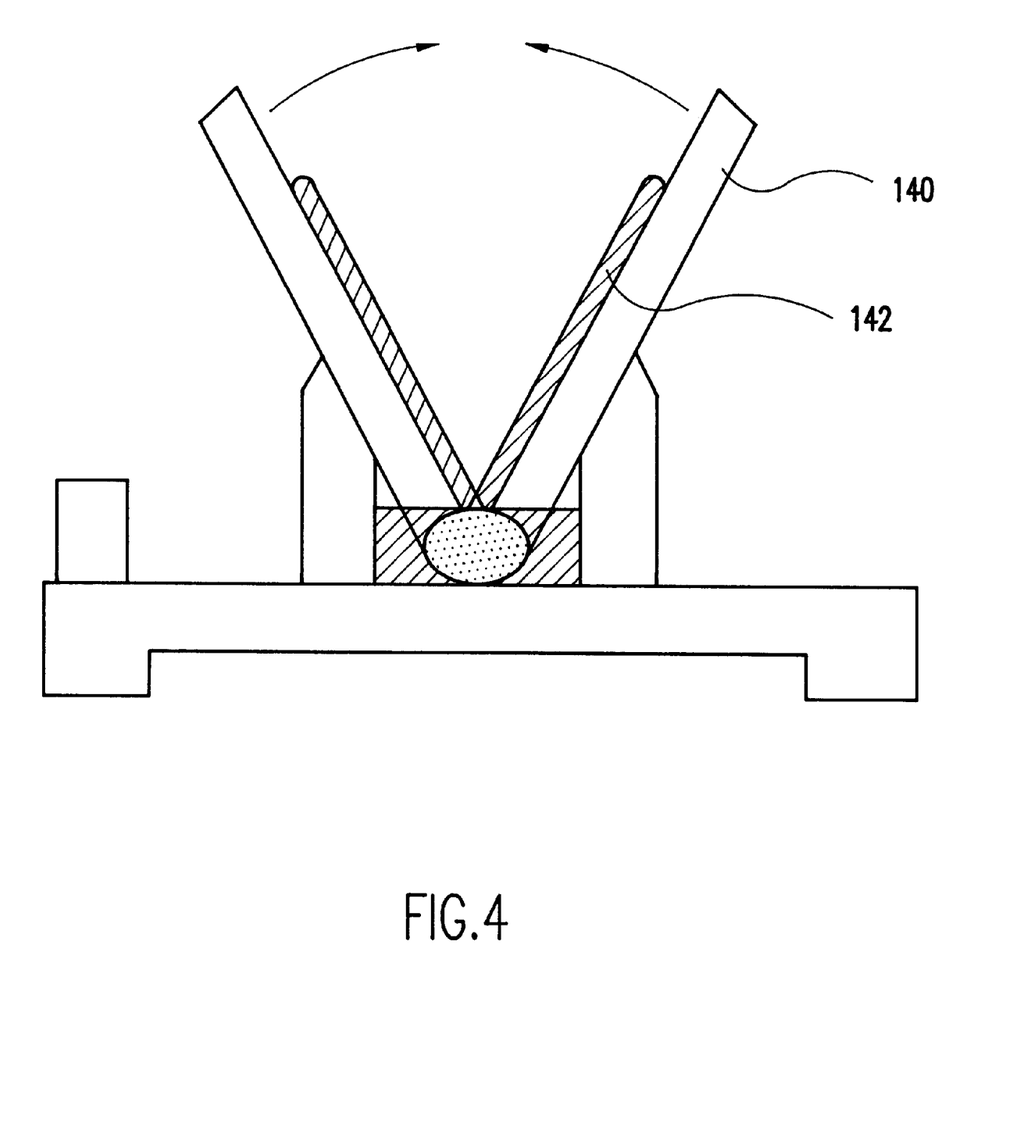
FIG. 4 depicts a joining machine that is used at the time of manufacturing the DRAM in accordance with the second preferred embodiment of this invention.

After the thermal oxide layer is grown to a thickness of 10 nm, and an oxide layer is applied by CVD more thickly than the depth of the trench, a silicon nitride layer of 10 nm is deposited, and CVD oxide layer is deposited thereby making the resulting structure shown in FIG. 3B. The reason why the silicon nitride layer is inserted between the oxide layers is that a plate node 116 is deposited between storage node 118 and buried oxide 106 (silicon oxide layer/silicon nitride layer) thereby increasing the capacitance of the capacitor, while the SOI serves as a back gate.

Figure 3C:
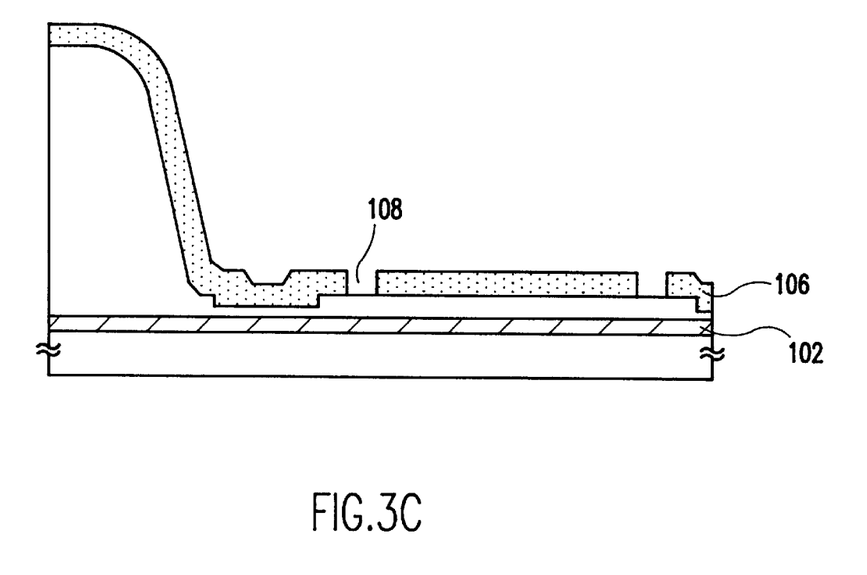
Figure 3D:
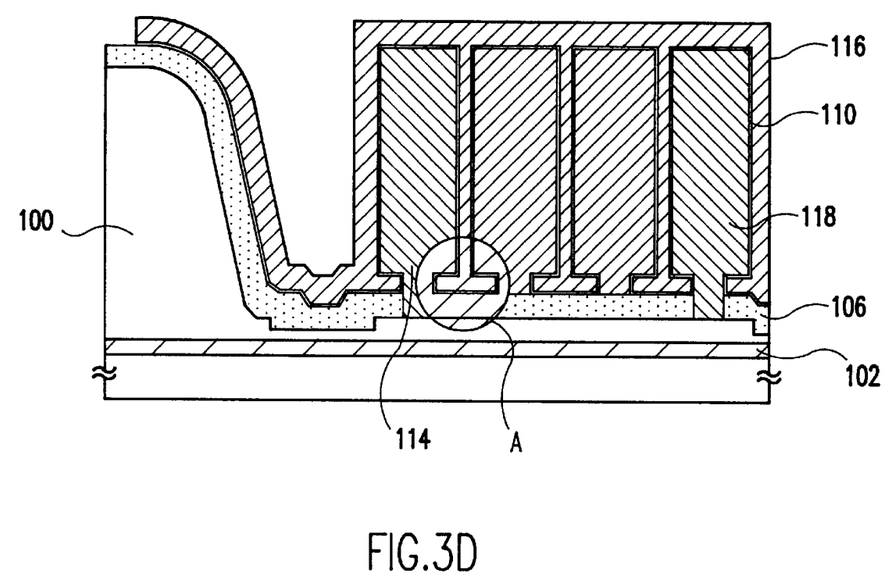
Figure 3E:
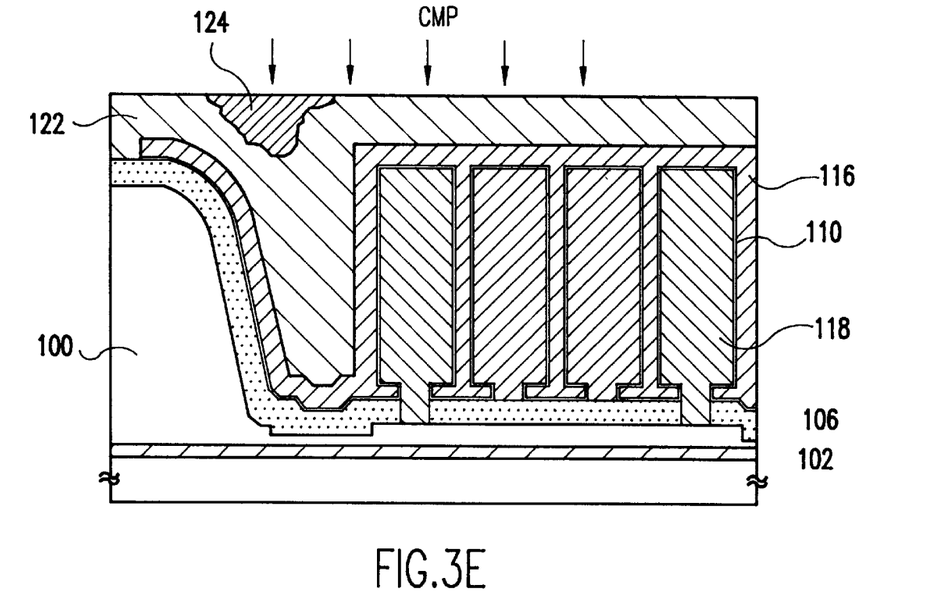

In the fifth step as seen in FIG. 3C, a buried contact hole 108 is formed through the complex buried oxide 106 (comprising, thermal oxide+HTO+SiN+HTO). This contact hole 108 connects the subsequently formed storage node to the thin SOI. Phosphorous is ion-implanted to the above contact hole.

The capacitor formed in the sixth step has a cylindrical shape or a crown shape in accordance with the selected design rule, the required storage capacitance, etc. First, insitu phosphorous doped poly silicon is applied to a thickness 200 nm greater than the depth (I) of the recess in order tio assure that the planarity is acceptable at the time storage node 118 is patterned. Thereafter, the align-key formed in the third step is exposed. Storage node 118 is patterned using a CMP method. The oxide layer is wet-etched provided the oxide layer applied in the fourth step is exposed during the dry-etching of storage node 118. The silicon nitride layer formed in the fourth step serves as a stop layer for the etching process step. When the silicon nitride layer/oxide layer (NO) dielectric layer is formed and insitu-doped poly is applied, plate node 116 is applied between storage node 118 and the buried oxide layer, as shown in circle A of FIG. 3D. The plate node 116 is applied to a thickness of 100 to 200 nm and patterned to have the configuration shown in FIG. 3D.

The seventh step polishes the global topology and undulated surface of the resulting structure, so that a DWB process is possible. A CVD oxide layer and a borophosphorsilicate glass (BPSG) layer 122 is applied and reflowed at a temperature greater than 800° C. Polysilicon 124 is applied and the CMP process is carried out to form the resulting structure shown in FIG. 3E. The BPSG layer 122 serves as a stopping layer for this CMP process. The CVD oxide layer (including the BPSG) is overlaid and thermal treatment is carried out to complete the planarization.

Figure 3F:
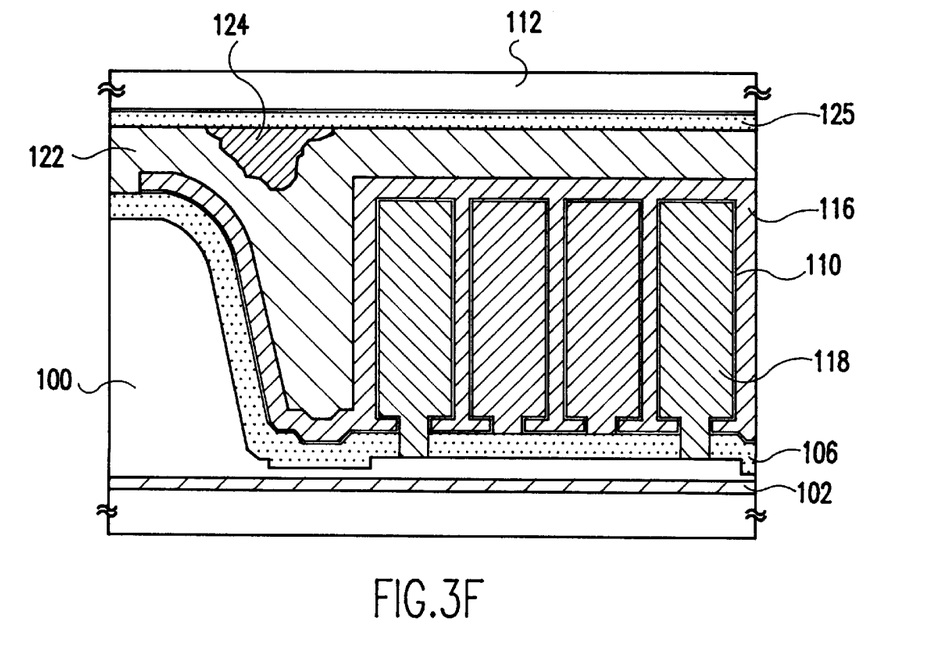

The eighth step, shown in FIG. 3F, is a step which joins the handle wafer 112 and the active wafer structure formed through the 7th step. This step includes a first sub-step wherein, the active wafer and the handle wafer to be joined together are dipped respectively in a mixed solution of sulfuric acid and aqueous hydrogenperoxide of 130° C. and a mixed solution of liquid ammonia and aqueous hydrogen-peroxide of 80° C. for a few minutes. The two wafers are dried and loose particles are then removed such that their surfaces are terminated in an alkali radical.

As a second sub-step, the two wafers are joined in the joining machine shown in FIG. 4, with the planarized surface of the active wafer facing the glass side of the handle wafer.

Table 1 below shows that misalignment of the rotational direction may be controlled to an angle of less than 0.010 if the wafers are joined together using the joining machine. Big misalignment causes a problem in the photoetching process following the tenth step.

As a third sub-step, two wafers are thermally treated for more than two hours in an ambient atmosphere of nitrogen at a temperature of over 800° C. A thermal oxide layer is subsequently formed in an ambient atmosphere of oxygen in order to increase joining intensity and to remove voids in the joining interface. Forming the thermal oxide layer helps prevent the handle wafer from being damaged when the silicon is wet-etched.

TABLE 1

The Result of Gauging the Misalignment of the Rotational Direction After the Joining of the Two Wafers

| Sample No. | Measured Degree |
|---|---|
| 1 | 0.008 |
| 2 | 0.008 |
| 3 | 0.001 |

Figure 3G:
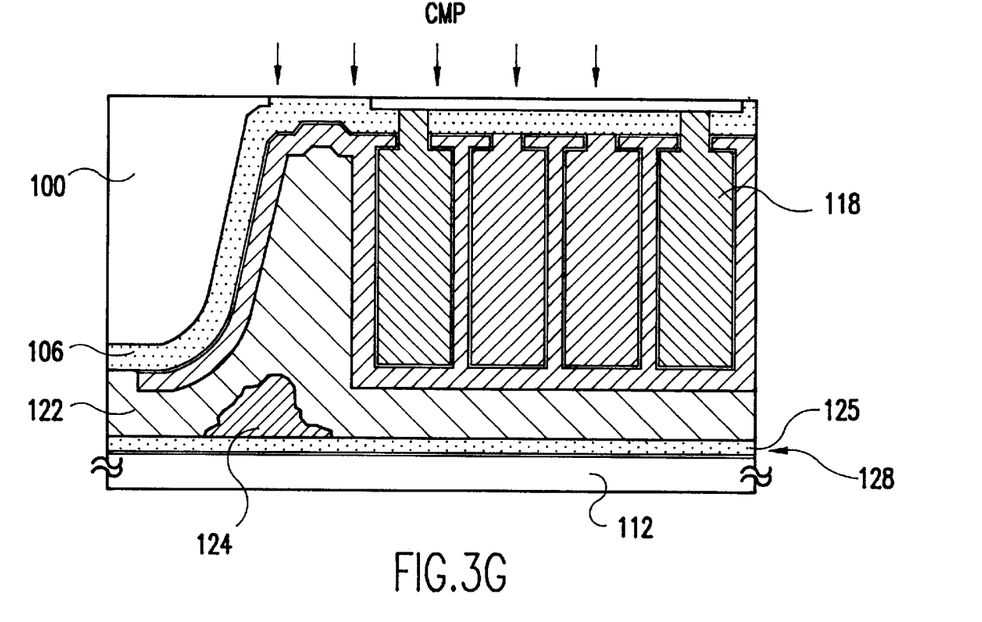

In the next 9th step, the active wafer passes through a series of backlapping/wet-etching/CMP processes. The backlapping is used for the purpose of enhancing throughput, since thinning the silicon by just CMP is too slow. The wet-etching removes silicon particles produced by the backlapping process which decreases the occurrence of scatches and prevents deterioration of the wafer in the subsequent CMP process. A uniform thickness of the silicon layer is achieved by use of the etchstopper. The silicon layer is thinned to a thickness of 50 $\mu$m by the backlapping process, and is then thinned to several micro-meters by means of the wet-etching process using a mixed solution of KOH/IPA of about 80° C. The remaining silicon is thinned by CMP. The oxide layer filled in the trench in the fourth step serves as a stopper to the CMP process, as shown in FIG. 3G.

Referring now to the tenth step, there now exists an area referred to the thin SOI area, i.e. the recessed memory cell area comprising the silicon oxide layer/silicon nitride layer/silicon oxide layer, and a thick SOI area corresponding to the non-recessed area. In the the tenth step, the thick SOI area is wet-etched to form a step-like difference of about 300 nm down from the surface of the thin SOI area. Following the wet-etching, isolation of electrical elements to be formed in the thick SOI area is performed by LOCOS. The oxide layer formed on the nitride layer in the thin SOI area is removed during this etching process of the oxide layer in the thick SOI area, but the nitride layer and the oxide layer formed underneath the nitride layer remained.

In the eleventh step, after n-type and p-type MOS transistors, register patterns, etc. are formed in the thick SOI area, an oxide layer formed by CVD is applied such that it is higher than the top of the remaining silicon nitride layer in the thick SOI area by about 200 nm. The CVD oxide layer is planarized by CMP using the nitride layer as a stopper. The nitride layer and the oxide layer are wet-etched to yield the resulting structure shown in FIG. 3H.

Figure 3H:
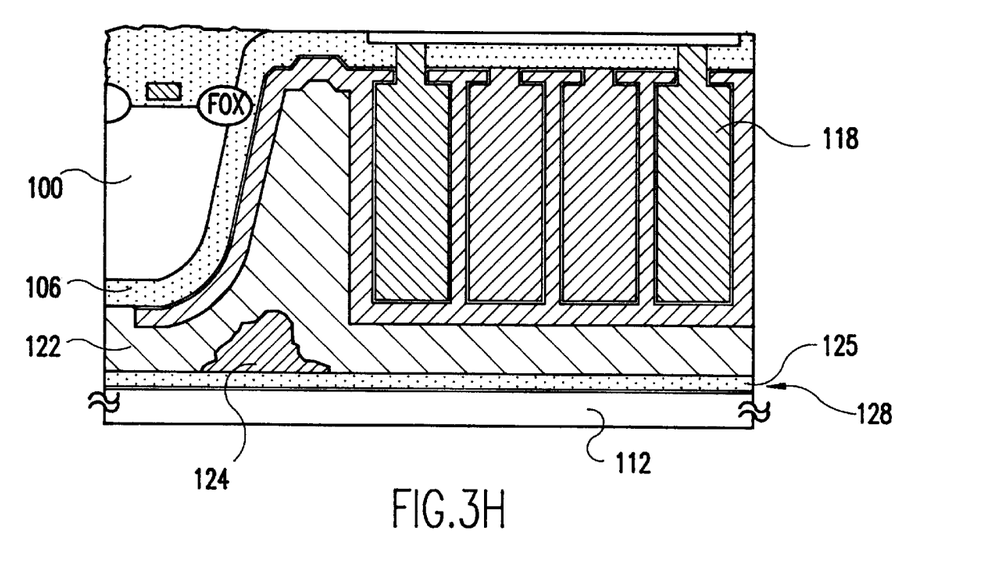

In the twelfth step, a thermal oxide layer of 50 nm is formed. An oxide layer is formed having a thickness greater than 150 nm in the region having the phosphorous out-diffused in storage node 118 formed in the sixth step after the ion-implantation in the fifth step. The oxide layer of 60 nm is wet-etched and the gate oxide layer is again formed. Gate electrodes 126 are then formed, and source/drain regions are formed to form SOI transistors. The gate electrode 126 is formed of metal, e.g. W or composite of Ti nitride layer and metal, and then patterned to form a line in thick SOI area, while simultaneously patterning the gate line. After that, a CVD oxide layer is applied as an interlayer insulating layer.

In the thirteenth step, a (second) contact hole and a bit line contact are simultaneously formed over plate node 116 of the memory cell, and the gate electrode of the peripheral circuit(s), with the metallization of the peripheral circuit(s). Referring now to FIG. 3I, bit-line 127 is formed on the pattern where the (second) contact hole is formed. The bit-line is formed of metal, and is patterned simultaneously with the line of the thick SOI region to yield the structure of FIG. 3I. The reference numerals appearing in the drawing designate the following elements: ONO 110; an oxide layer 125; a bonded interface 128; and SiO$_2$ layer 129.

When it comes to the fifteenth step, customary semiconductor manufacturing processes such as passivation and alloying are carried out on the foregoing structure to complete a DRAM.

In the first preferred embodiment of this invention, even if the storage node is raised to secure the capacitance of the capacitor at the time of manufacturing a DRAM, there is no problem with the step-like difference between the peripheral area and the memory cell area. Even if the device is highly integrated, the lateral surface area occupied by one capacitor is relatively small, but the height of the capacitor may be increased, such that sufficient capacitance can be secured. Since the method of manufacturing the DRAM begins with forming the capacitor, with the transistor being formed thereafter, potential deterioration of transistor characteristics is prevented as often occurs in conventonal methods due to a weak junction caused by the subsequent thermal treatment. Thus, subsequent processing steps may be easily carried out.

Additionally, since the memory cell area is recessed by the shallow trench method, a thick oxide layer is not used for isolation of electrical elements to facilitate the formation of the contact hole for grounding the plate node of the capacitor on the borderline of the peripheral area and the cell area. Referring to the second preferred embodiment, the advantages of DWB and SOI techniques are maintained by forming the SOI devices just in the specified areas including the memory cell area, and problems such as step coverage and etch damage caused by increasing the planarity to overcome the step-like difference of the capacitor can be solved. The technique applied to the bulk silicon may be directly applied to the devices of the peripheral circuit(s).

What is claimed is:

1. A semiconductor memory having a memory cell portion and a peripheral portion, comprising:
   a substrate having top, bottom, and side surfaces, the substrate being formed only in the peripheral portion;
   a silicon-on-insulator layer, formed in the memory cell portion, having top and bottom surfaces, wherein the bottom surface of the silicon-on-insulator is higher than the bottom surface of the substrate;
   a first insulating layer formed under the silicon-on-insulator layer and on the side surface of the substrate, wherein a contact hole is formed in a portion of the first insulating layer in the memory cell portion to expose the silicon-on-insulator; and
   a capacitor formed in the memory cell area, wherein the capacitor has a storage node electrically connected to the silicon-on-insulator layer through the contact hole, an insulator surrounding the storage node, and a plate node surrounding the insulator.

2. The semiconductor memory of claim 1, further comprising:
   a gate electrode formed over the silicon-on-insulator layer.

3. The semiconductor memory of claim 1, wherein the storage node comprises a first doped polysilicon layer in electrical contact with the silicon-on-insulator layer and a second doped polysilicon layer formed under the first doped polysilicon layer.

4. The semiconductor memory of claim 3, wherein the impurity of the first doped polysilicon layer is diffused from the second doped polysilicon layer.

5. The semiconductor memory of claim 1, wherein the plate node extends to a border between the memory cell portion and the peripheral portion.

6. The semiconductor memory of claim 1, wherein the silicon-on-insulator layer is thinner than the substrate.

7. The semiconductor memory of claim 1, wherein the bottom surface of the silicon-on-insulator is higher than the top surface of the substrate.

8. A semiconductor memory having a memory cell portion and a peripheral portion, comprising:

a substrate having a side surface, the substrate being formed only in the peripheral portion;

a silicon-on-insulator layer, formed in the memory cell portion, having a thickness thinner than the substrate;

a first insulating layer formed under the silicon-on-insulator layer and on the side surface of the substrate, wherein a contact hole is formed in a portion of the first insulating layer in the memory cell portion to expose the silicon-on-insulator; and a capacitor formed in the memory cell area, wherein the capacitor has a storage node electrically connected to the silicon-on-insulator layer through the contact hole, an insulator surrounding the storage node, and a plate node surrounding the insulator.

9. A semiconductor memory having a memory cell portion and a peripheral portion, comprising:

a substrate having a side surface, the substrate being formed only in the peripheral portion;

a silicon-on-insulator layer, formed in the memory cell portion, located at a higher level than the substrate;

a first insulating layer formed under the silicon-on-insulator layer and on the side surface of the substrate, wherein a contact hole is formed in a portion of the first insulating layer in the memory cell portion to expose the silicon-on-insulator; and a capacitor formed in the memory cell area, wherein the capacitor has a storage node electrically connected to the silicon-on-insulator layer through the contact hole, an insulator surrounding the storage node, and a plate node surrounding the insulator.

* * * * *